(12) United States Patent
Büber et al.

(10) Patent No.: US 9,614,267 B1
(45) Date of Patent: Apr. 4, 2017

(54) BROADBAND RF CAPACITORS FOR COAXIAL LINE

(71) Applicant: Maury Microwave, Inc., Ontario, CA (US)

(72) Inventors: M. Tekamül Büber, Anaheim, CA (US); Sathya Padmanabhan, Glendora, CA (US); Bruce J. Pluth, La Verne, CA (US)

(73) Assignee: Maury Microwave, Inc., Ontario, CA (US)

( * ) Notice: Subject to any disclaimer, the term of this patent is extended or adjusted under 35 U.S.C. 154(b) by 0 days.

(21) Appl. No.: 15/156,199

(22) Filed: May 16, 2016

(51) Int. Cl.
| | |
|---|---|
| *H01P 5/02* | (2006.01) |
| *H01P 3/06* | (2006.01) |
| *H01P 1/04* | (2006.01) |
| *H03H 7/38* | (2006.01) |
| *H01B 11/18* | (2006.01) |

(52) U.S. Cl.
CPC .......... *H01P 5/026* (2013.01); *H01B 11/1834* (2013.01); *H01B 11/1895* (2013.01); *H01P 1/045* (2013.01); *H01P 3/06* (2013.01); *H03H 7/38* (2013.01)

(58) Field of Classification Search
CPC .......... H01P 1/045; H01P 1/125; H01P 1/202; H01P 1/225; H01P 1/266; H01P 3/06; H01P 5/026; H03H 7/38; H01B 11/1895; H01B 11/1834
USPC ....... 333/222, 236, 239, 245, 248, 254, 255, 333/24 C
See application file for complete search history.

(56) References Cited

U.S. PATENT DOCUMENTS

| | | | |
|---|---|---|---|
| 2,516,529 A | 7/1950 | Raymond | |
| 3,078,386 A | 2/1963 | Fischer | |
| 3,393,384 A | 7/1968 | Bailey et al. | |
| 4,616,195 A * | 10/1986 | Ward | H01P 1/202 333/156 |
| 5,519,328 A * | 5/1996 | Bennett | G01R 29/24 324/659 |
| 5,977,841 A * | 11/1999 | Lee | H01P 1/045 333/24 C |
| 6,798,310 B2 | 9/2004 | Wong et al. | |
| 7,348,869 B2 * | 3/2008 | Jakob | H01P 1/202 333/207 |
| 7,589,601 B2 | 9/2009 | Simpson | |
| 2010/0127801 A1* | 5/2010 | Adkins | H01P 1/202 333/206 |

* cited by examiner

*Primary Examiner* — Benny Lee
*Assistant Examiner* — Jorge Salazar, Jr.
(74) *Attorney, Agent, or Firm* — Larry K. Roberts

(57) ABSTRACT

Embodiments of a broadband capacitor in a coaxial line are described. A capacitor may be realized in the center conductor of the coaxial line, and this aspect has two different embodiments. One embodiment forms the capacitor between the flat faces of an interrupted inner conductor structure. A second embodiment forms the capacitor between overlapping fingers of the female inner conductor and the male inner conductor, where the fingers can be realized in different ways. In another embodiment, a capacitor is realized in the outer conductor of the coaxial line, between fingers of a female portion of the outer conductor and a male portion of the outer conductor, where the fingers can be realized in different ways.

17 Claims, 9 Drawing Sheets

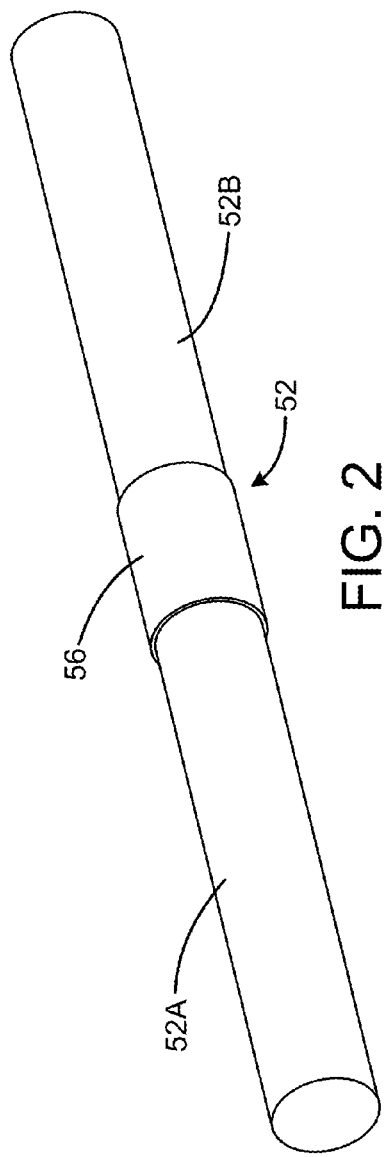
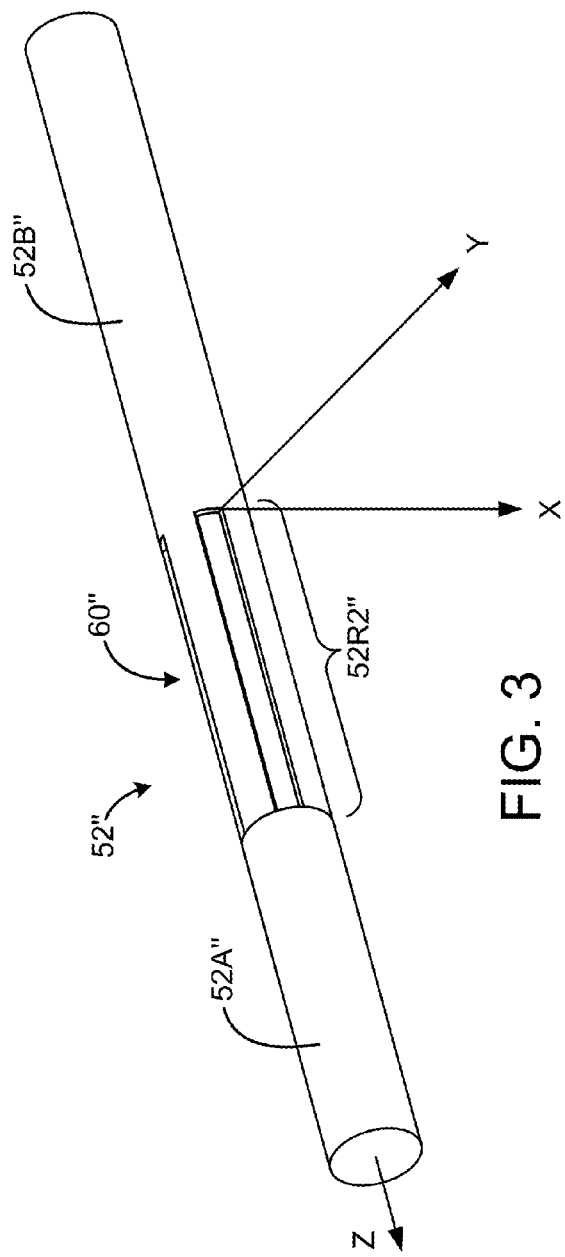

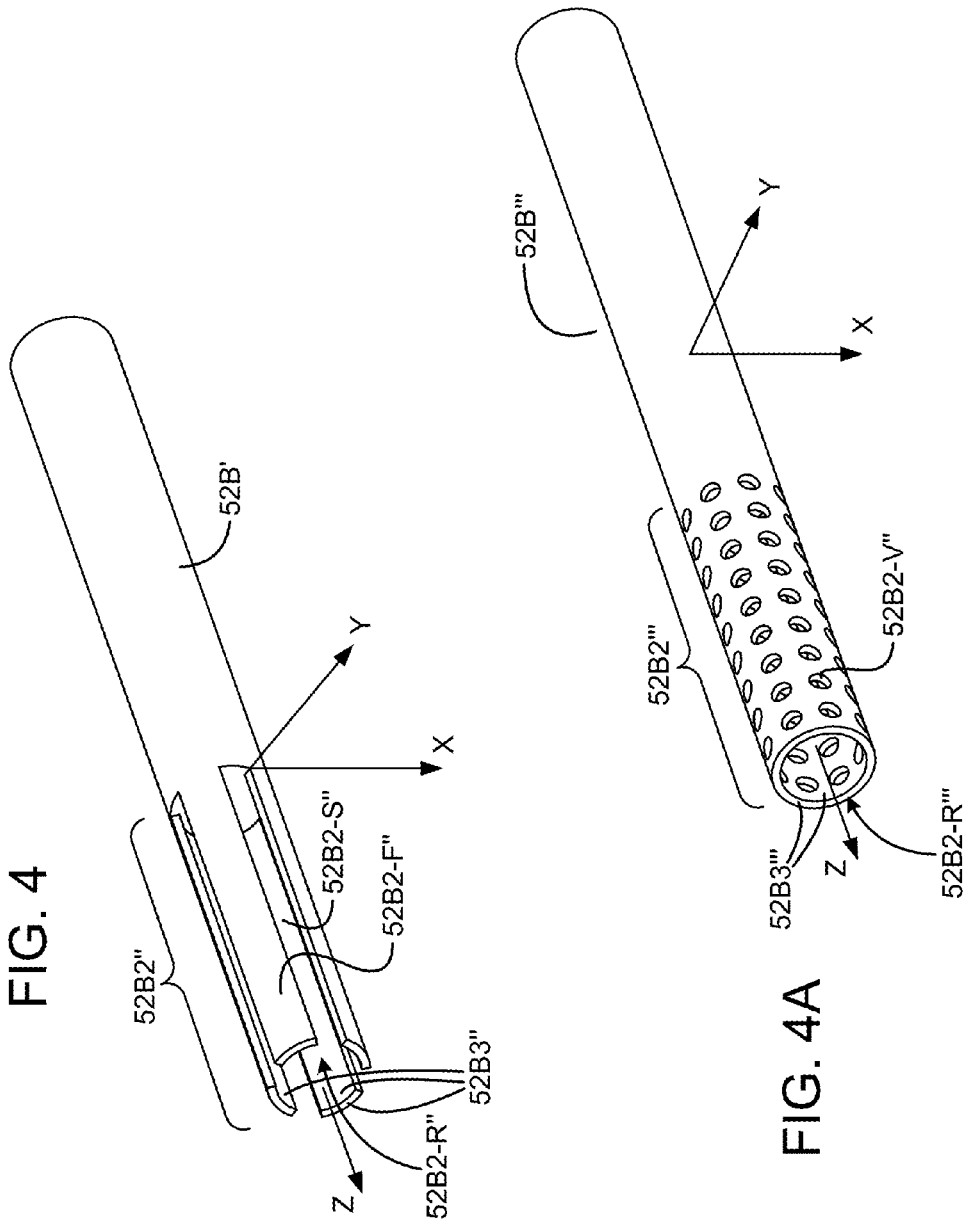

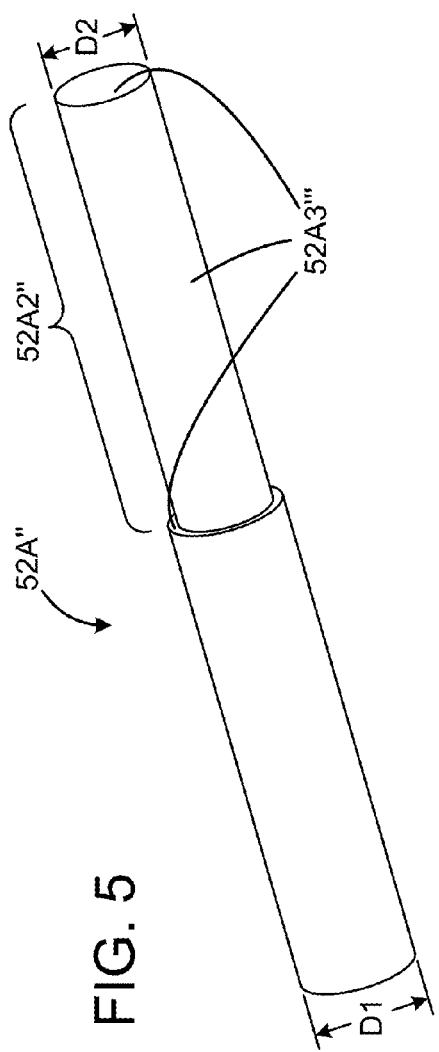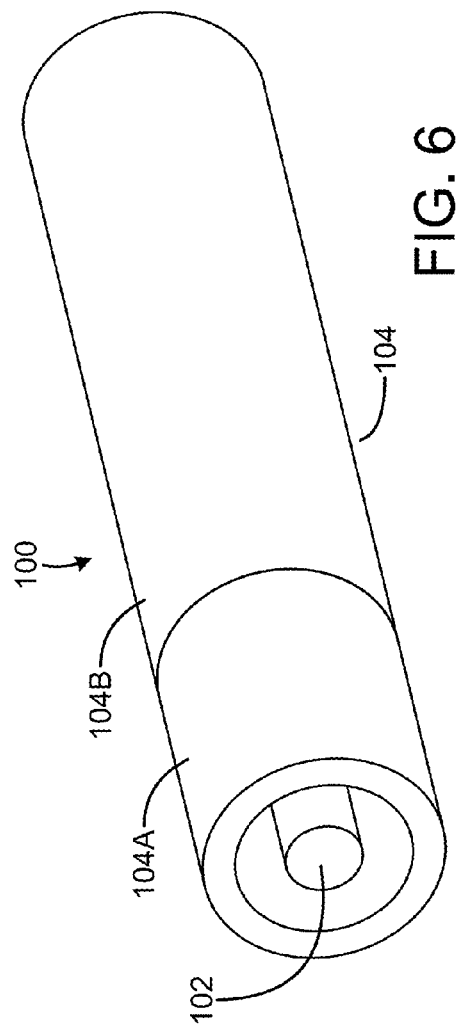

BROADBAND RF CAPACITORS FOR COAXIAL LINE

BACKGROUND

Good broad band RF capacitances with minimal parasitic, especially minimal inductances to avoid resonances, are very important for many RF applications, such as bias tees. Some chip capacitors are available for use on substrate materials for microstrip or coplanar waveguides, however broadband capacitors for use in coaxial lines are not available. Since coaxial lines have much less insertion loss than transmission lines on substrates, such as microstrip or coplanar waveguide, it would be very desirable to have broadband capacitors for coaxial lines.

BRIEF DESCRIPTION OF THE DRAWINGS

Features and advantages of the disclosure will readily be appreciated by persons skilled in the art from the following detailed description when read in conjunction with the drawing wherein:

FIG. 2 is an isometric diagrammatic view of the interrupted center conductor of FIG. 1, with a plastic sleeve to hold the interrupted center conductor mechanically in place.

FIG. 3 is an isometric diagrammatic view illustrating aspects of another embodiment of a coaxial line center conductor capacitor.

FIG. 4 is an isometric diagrammatic view of a female portion of one part of the center conductor of the embodiment of FIG. 3. FIG. 4A is an isometric diagrammatic view of an alternate embodiment of a female portion of the center conductor.

FIG. 5 is an isometric diagrammatic view of a male end portion of the center conductor of the embodiment of FIG. 3, illustrating a dielectric coating on the male end portion.

FIG. 6 is an isometric diagrammatic view of another embodiment of a capacitor in a coaxial airline, in which the outer conductor is interrupted and forms a female end portion and a male end portion.

DETAILED DESCRIPTION

Figure 1:
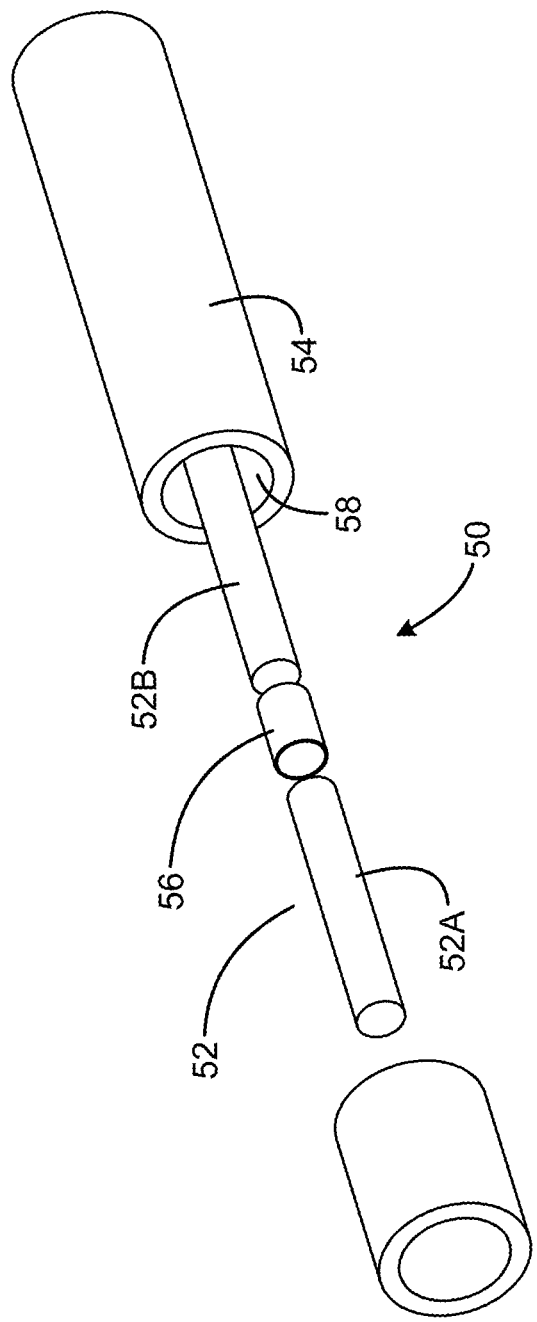
FIG. 1 is an isometric diagrammatic view of a coaxial airline incorporating an exemplary embodiment of a capacitor.

In the following detailed description and in the several figures of the drawing, like elements are identified with like reference numerals. The figures are not to scale, and relative feature sizes may be exaggerated for illustrative purposes.

In accordance with aspects of the invention, several embodiments of a broad band capacitor in a coaxial line are described. In accordance with one aspect, a capacitor is realized in the center conductor of the coaxial line, and this aspect has two different embodiments. One embodiment forms the capacitor between the flat faces of an interrupted center conductor. A second embodiment forms the capacitor between overlapping fingers of the female center conductor portion and the male center conductor portion, where the fingers can be realized in different ways.

In accordance with a further aspect, a capacitor may be realized in the outer conductor of the coaxial line, between fingers of a female portion of the outer conductor and a male outer conductor portion, where the fingers can be realized in different ways.

It will be appreciated that the capacitors can be implemented in coaxial lines generally, i.e. with coaxial airlines as well as coaxial lines with dielectric replacing the air between the inner and outer conductors.

To realize the capacitor in the center conductor of the coaxial line in accordance with a first embodiment, the center conductor structure is cut or interrupted somewhere along the coaxial line, and a dielectric layer is disposed between the adjacent faces of the interrupted center conductor portions. The dielectric layer may be a dielectric material layer which is a separate structure from the center conductor portions. Preferably, however, the dielectric layer is formed by a dielectric coating. The cross sectional face of one or both the facing surfaces, depending on the desired dielectric thickness, may be coated with some dielectric coating material formed on the cut surface by a technique such as anodization or chemical vapor deposition (CVD). PARALYNE™ is the trade name for a variety of chemical vapor deposited poly(p-xylylene) polymers used as moisture and dielectric barriers. Exemplary anodizations include an anodized aluminum center conductor, with 9 um anodization thickness. Exemplary coatings for beryllium copper center conductors include PARALYNE™ type N coating with 2 um thickness, and PARALYNE™ type C coating with 5.25 um thickness.

It is to be understood that the interrupted center conductor portions need not be fabricated of the same conductive material. For example, one portion may be aluminum, and the other portion may be beryllium copper. Using conductors of different materials may be advantageous in applications in which only one end of the conductor is to be soldered to another component. In this case, the conductor portion to be soldered could be beryllium copper, and the other conductor portion may be aluminum.

Figure 1C:
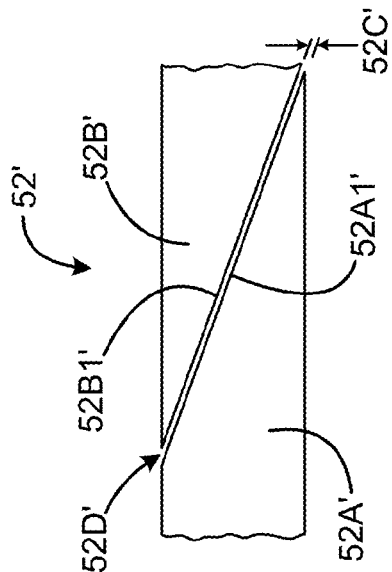
FIG. 1C is a diagrammatic enlarged view of an alternate embodiment of a center conductor capacitor.
Figure 1B:
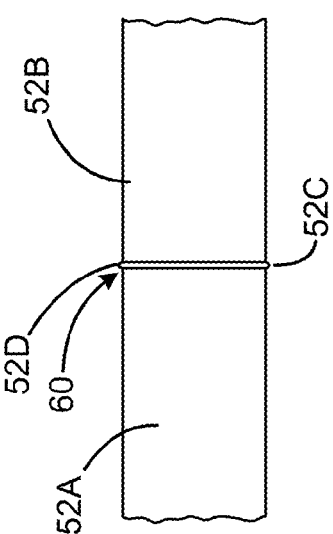
FIG. 1B is an enlarged view of the center conductor of FIG. 1A, showing the capacitor in further detail.
Figure 1A:
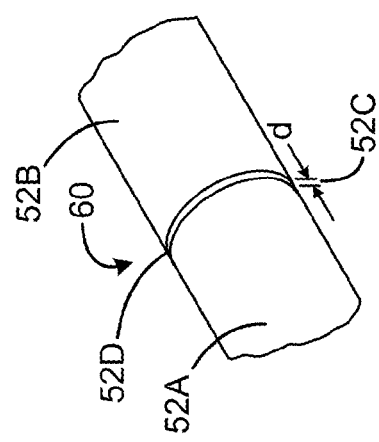
FIG. 1A is an isometric diagrammatic view of the center conductor of the coaxial air line of FIG. 1, illustrating the capacitor.

The capacitance value C that can be realized with this embodiment is approximated by the simple capacitance formula $$C = \epsilon_0 \epsilon_r A/d$$

where $\epsilon_0$ is the dielectric permittivity of air, $\epsilon_r$ is the relative permittivity of the coating material (dielectric), A is the cross sectional area of the center conductor of the air coaxial line, and d is the separation between the two center conductors, or equivalently the dielectric coating thickness (FIG. 1A).

The practical minimum coating thickness known now is 2 um. Once thinner coating thicknesses becomes practically realizable in the future, thinner coatings and gap dimensions could be used. Any coating thickness greater than zero may be used, and usually the thinner the greater the capacitance value by the above formula. There is no upper limit for the thickness. The above examples of coatings provide coatings of thickness between about 2 um and 10 um. One can use dielectric pieces instead of a coating.

FIG. 1 is an exploded, diagrammatic isometric view of an exemplary embodiment of a coaxial line 50 embodying aspects of the invention. FIGS. 1A, 1B and 2 further illustrate the exemplary embodiment. The transmission line 50 is defined by an inner conductor 52 and an outer conductor 54. The inner conductor 52 is interrupted into two segments 52A, 52B, which are separated by a gap 52C having a separation distance d (FIG. 1A). A gap 58 is defined between the inner and outer conductors. The gap may be open (air-filled), or filled with a dielectric material. In this exemplary embodiment, a dielectric coating or layer 52D separates the opposed faces of the two inner conductor segments. As discussed above, the dielectric layer 52D may be a coating applied to one or both of the opposed faces of the inner conductor segments.

Usually, the coaxial lines used in the industry are standardized, so the diameter of the center conductor and outer conductor are determined, not a variable. This means that the cross sectional area A of the center conductor is a fixed value. The only two parameters that the designer can vary to achieve desired capacitance values are the thickness of the coating material and the coating material itself, i.e., the relative permittivity of the coating material. A short and thin plastic sleeve 56 (FIG. 1) may be placed over the capacitance to keep the two segments 52A, 52B of the center conductor 52 mechanically stable in place, as illustrated in the isometric view of FIG. 2. The effect of this sleeve is minimal if it is thin, short and from a material with low relative permittivity, such as LEXAN™. If one wants to be more accurate to reduce mismatches inside the coaxial line, one can design a step into the center conductor to get a 50 Ohm match for this sleeve section. This usually decreases the cross sectional area of the capacitor, hence reducing the maximum achievable capacitance value.

The center conductor segments or portions may be defined by opposing faces which are perpendicular to the axis of the center conductor, as illustrated in FIGS. 1, 1A and 1B. Alternatively, the center conductor structure faces may be formed on a diagonal, so that the opposing faces present a larger cross-sectional area and thus an increased capacitance.

FIG. 1C shows an embodiment of a center conductor 52' in which the segments 52A' and 52B' are formed on a diagonal relative to the center axis of the conductor. The opposed faces 52A1' and 52B1' present increase area compared to the embodiment of FIG. 1B, and the gap 52C' is filled with a dielectric layer or coating 52D'. The center conductor structure faces may be formed at any angle from the perpendicular, and this will improve the low frequency response by increasing the capacitance; an exemplary angle from the perpendicular is 70 degrees. The high frequency response may be slightly distorted, but the capacitor will still be usable over a wide frequency band.

Figure 1D:
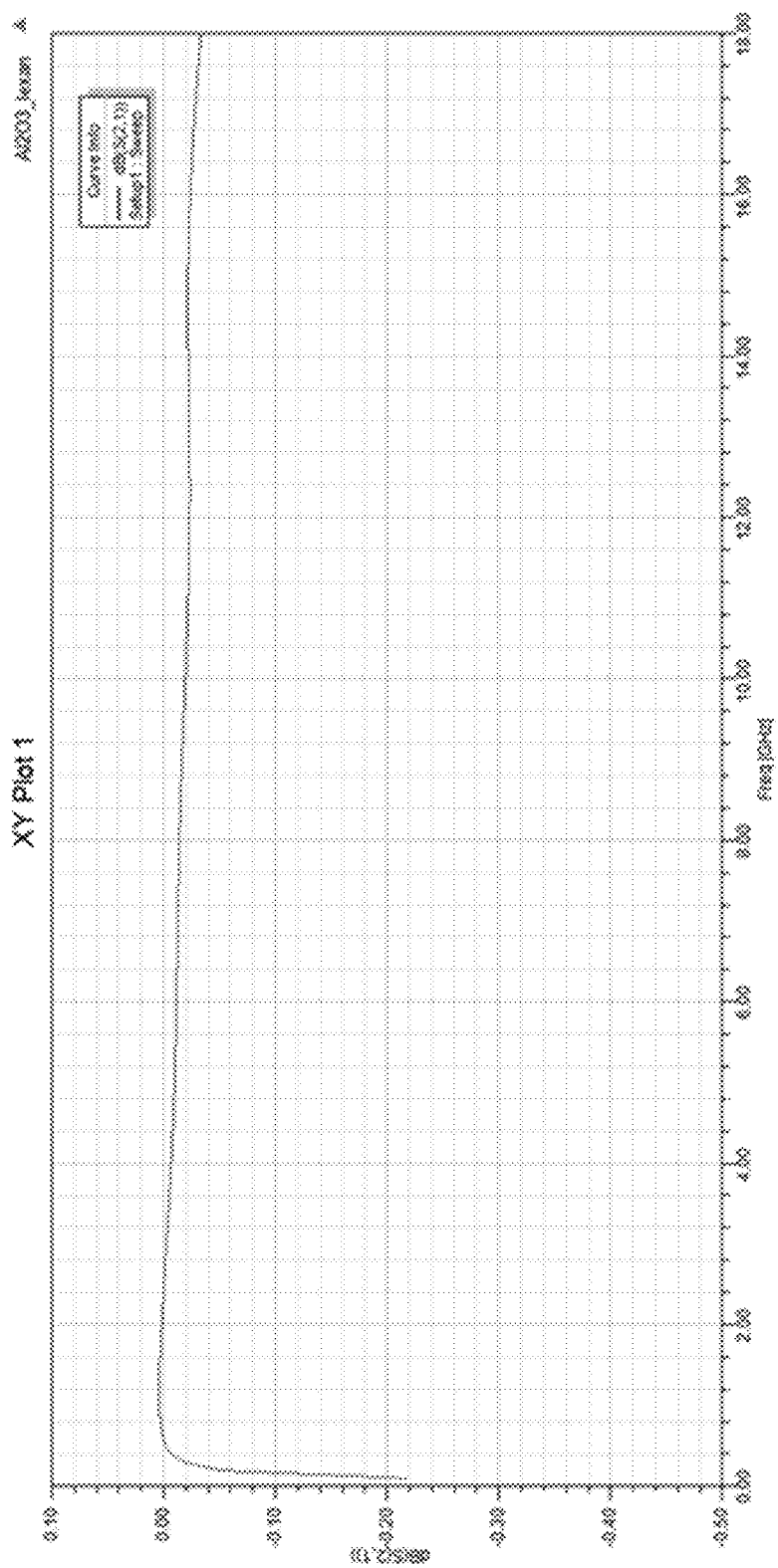
FIGS. 1D and 1E are graphs plotting responses of the capacitors of FIGS. 1B and 1C, respectively.
Figure 1E:
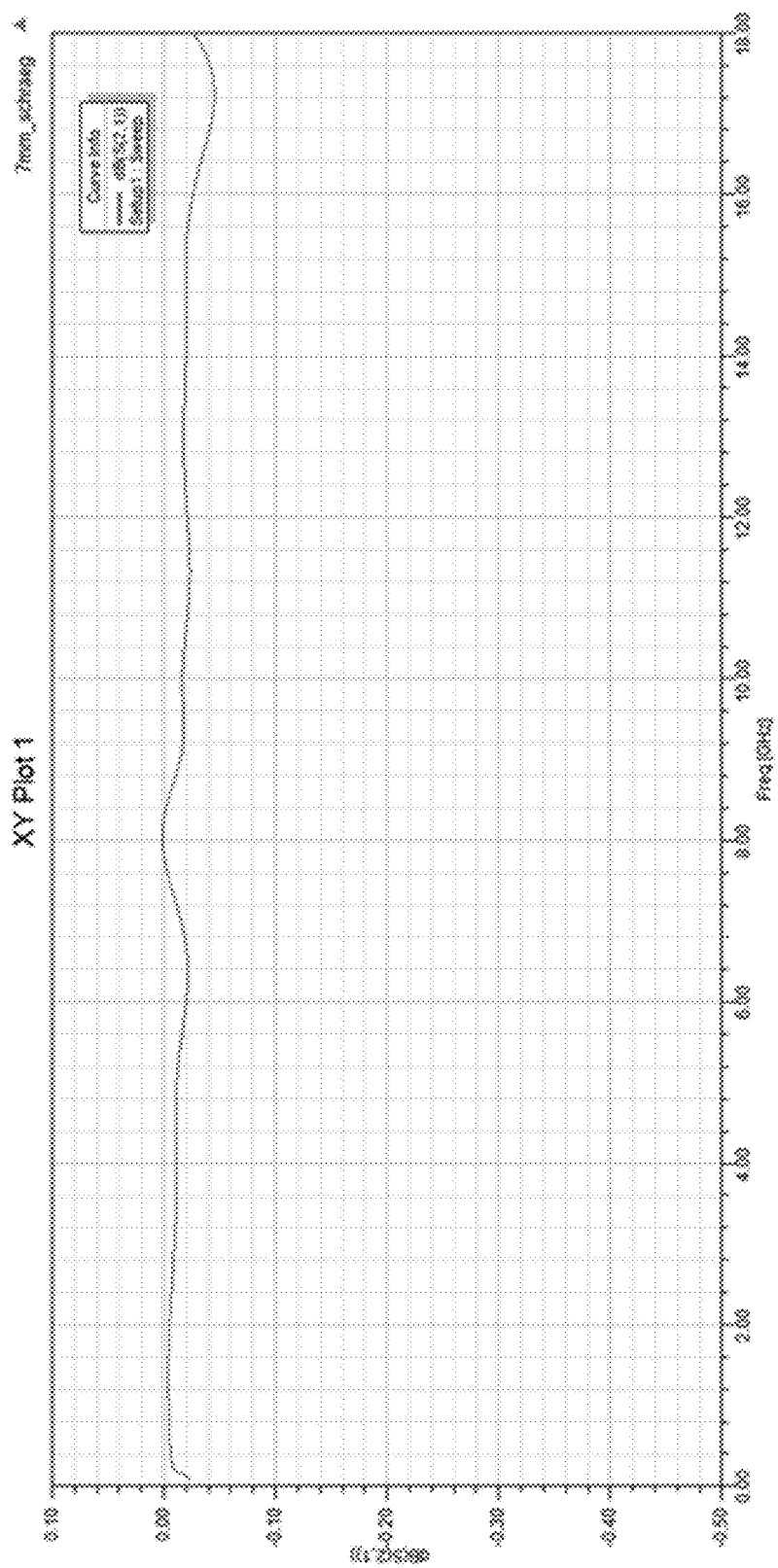

FIGS. 1D and 1E, respectively, illustrate simulated, computed frequency responses of the coaxial line with an integrated capacitor FIG. 1D illustrates the computed frequency response of the coaxial line with capacitor illustrated in FIGS. 1, 1A and 1B, with the facing faces of the conductor segments oriented perpendicular to the axis of the center conductor. FIG. 1E illustrates the computed frequency response of the coaxial line with capacitor illustrated in FIG. 1C, for a diagonal cut of 20 degrees from the center conductor axis. Both FIGS. 1D and 1E are for the example of a 7 mm coaxial airline. Those skilled in the RF art will appreciate that 7 mm is the inner diameter of the outer conductor of a standard coaxial line with a standard 50 ohm impedance. The coaxial line may terminate at a connector. When one designs an air coaxial line, one typically adheres to the dimensional standards of the attached connectors. For example, the attached connector may be a 7 mm connector, and the air coaxial line is designed to adopt the dimensions of the 7 mm connector. For a 3.5 mm connector, the coaxial line would typically adopt the corresponding connector dimensions, and so on for other connector types. The coaxial line itself could have any dimensions as long as it does not support higher order modes in its operating band, Using the same dimensions as the connector has many advantages. For example, in the band of the connector, one knows that no higher order modes will propagate, and the transition from the connector to the coaxial line will be smooth, eliminating the need for a matching network. Other widely used standard connector include, for example, N type, 3.5 mm, 2.4 mm, 2.92 mm, 1.85 mm and 1 mm. The integrated capacitors described herein may be implemented in any coaxial line, air filled or dielectric filled.

Extremely broad band coaxial capacitors can be achieved with the embodiments of FIGS. 1, 1A-1C, but the capacitance value is limited by the available coating material (dielectric) with its relative permittivity and the minimum thickness that is practically achievable by current process methods.

Even greater capacitance values can be achieved using fingers on the center conductor structure. Here, one segment of the center conductor structure at its end is reduced in diameter to form a male connector portion or pin and is coated with dielectric, and the second segment of the center conductor structure is formed as a fingered female connector portion. The fingers of the female connector portion slide over the male connector portion of the center conductor, to provide a capacitance between the fingers of the female connector portion and the dielectric-coated male connector portion (FIGS. 3-5). The fingers can be realized many different ways, either as finger-like protrusions, or as many vias in the female connector portion.

FIGS. 3-5 illustrate an embodiment in which a capacitor is formed in the center conductor structure 52" of a coaxial line by a finger configuration. For clarity, only the center conductor is illustrated; the outer conductor may be as shown in FIG. 1. The center conductor 52" is formed by two segments 52A" and 52B". The segment 52A" has an end, male portion 52A2" having a reduced cross-sectional diameter D2 with respect to the nominal diameter D1 of the center conductor. The outer surfaces of the male portion may be coated with a dielectric coating 52A3" as indicated in FIG. 5.

FIG. 4 illustrates the center conductor segment 52B" having a female end portion 52B2", in which a plurality (four in this example) of finger-like protrusions 52B2-F" are defined by elongated slots 52B2-S" defined in the outer periphery of the female portion. A hollow receptacle 52B2-R" is defined by the finger-like protrusions, of inner diameter sized to accommodate the male end portion 52A2" in a sliding fit. The interior and end surfaces of the finger-like protrusions and the receptacle may be coated with a dielectric coating 52B3". The dielectric coating may alternatively be provided on either the male end portion or the female end portion. FIG. 3 illustrates the assembled center conductor structure 52". The number of finger-like portions, their spacing and length can vary depending on the application. Preferably, the finger-like portions should be as thin as possible, for best performance.

An alternate form of a female center conductor end portion 52B''' is illustrated in FIG. 4A. Here, the fingers are formed by vias 52B2-V'' formed through the outer periphery of the receptacle 52B2-R'''. The via diameters, spacing and number of vias may vary depending on the application. One example, for a 7 mm coaxial line, has via diameters of 0.5 mm with a center to center spacing of 1 mm. The interior and end surfaces of the female end portion 52B2''' and the receptacle may be coated with a dielectric coating 52B3'''. The dielectric coating may alternatively be provided on either the male end portion or the female end portion.

Figure 7:
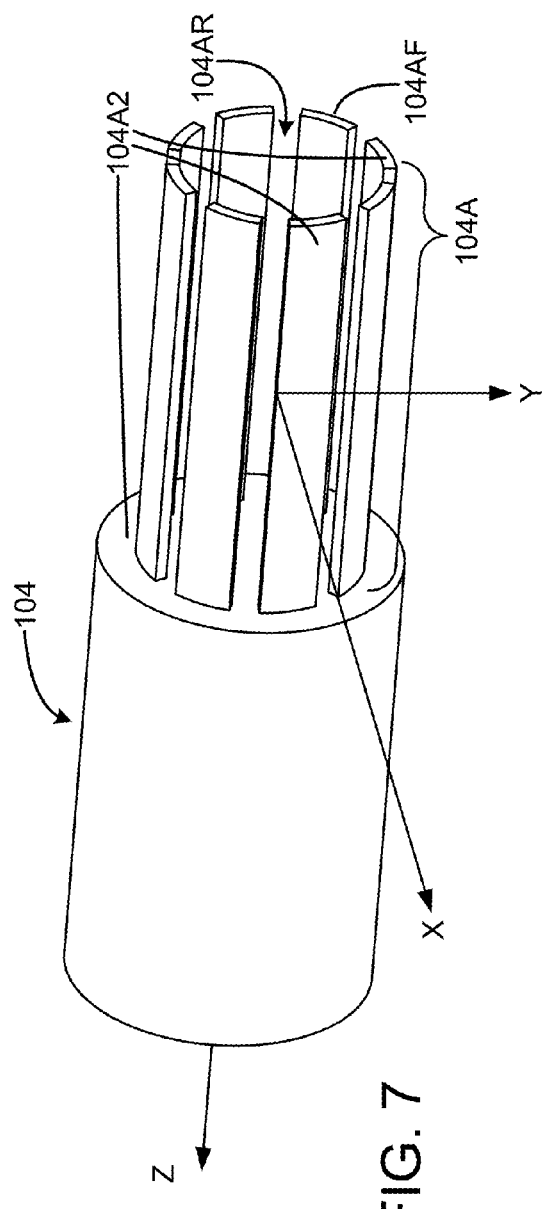
FIG. 7 is an isometric diagrammatic view illustrating the male outer conductor end portion of the embodiment of FIG. 6.
Figure 7A:
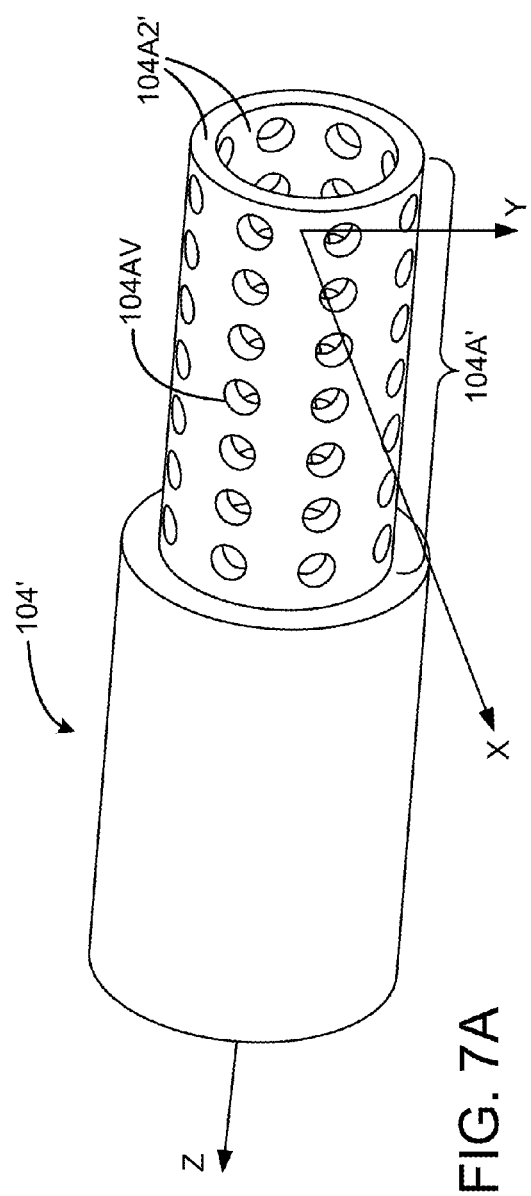
FIG. 7A is an isometric diagrammatic view illustrating an alternate embodiment of the male outer conductor end portion.

The vias 52B2-V'' define holes in the thin female portion that fits over the male portion instead of the finger protrusions of FIG. 4. The concept is to have some current path from one side of the thin metal female portion to the other side. This current path could be provided by fingers, as in the embodiment of FIG. 4, or by some holes or vias, as in FIG. 4A, or by any other opening through the female conductor portion. The drawback is that these holes will reduce the surface area of the capacitor, which will reduce the capacitance value. But on the other hand, the holes will provide the current path, reducing the parasitic inductance. Some kind of current path from one side to the other side of the female center conductor portion may be formed by openings, either as fingers or holes similar to via holes or some other openings. In the center conductor embodiment of FIG. 4, the current flows on the outside of the center conductor. The fingers or vias are on the female side of the center conductor. In order for the current to be capacitively coupled to the male center conductor, it must flow to the inside. Without the finger or via openings, the current would have to go all the way to the end of the female tip on the outside and then turn around and flow back on the inside and couple to the male center conductor while it is flowing back inside. This increases resonance effects which are modeled as parasitic inductance. On the other hand, with openings such as fingers or vias, the current does not have to flow all the way to the end then flow back, rather the current can now flow from outside to the inside through the openings to the inside and couple to the male center conductor. The situation is similar with an embodiment with fingers or vias in the outer conductor, such as illustrated in FIGS. 7 and 7A. On the outer conductor, the current flows on the inside. Here the male portion has fingers or vias, so the current on the inside of the male connector has to transfer to the outside in order to capacitively couple to the female portion. When the openings between fingers or in the vias are present, the current can transition from the inside to the outside easily without having to travel all the way to the end tip and flow back.

The male or the female or both sides could have the dielectric coating. But in order to keep the capacitance high, one wants to keep the dielectric layer as thin as possible; therefore, it may be preferable to coat only one side. Coating is one type of dielectric that can be extremely thin, on the order of 2 mm or higher. As one increases the thickness, the capacitance value decreases, which is usually not desirable. Instead of a coating, the dielectric layer could be a thin layer squeezed between the opposed faces of the center conductor portion.

The capacitance values that can be realized with the embodiments of FIGS. 3-5 depend on the dielectric coating and its relative permittivity and the surface area between the fingers of the female connector portion of the center conductor and the pin of the male center conductor portion. In these embodiments of the capacitor, the designer has a greater flexibility in controlling the capacitance as compared to the embodiment of FIGS. 1-2, since the area can be varied by changing the finger length as well as by using different dielectric coatings. The disadvantage is that these embodiments have slightly more parasitic inductance as compared to the embodiment of FIGS. 1-2. One might choose this embodiment in coaxial lines whose center conductor is relatively thin and its cross sectional area is relatively small. And making the fingers longer to increase the capacitance further is expected to increase the parasitic inductance even further, setting practical limitations.

Figure 8:
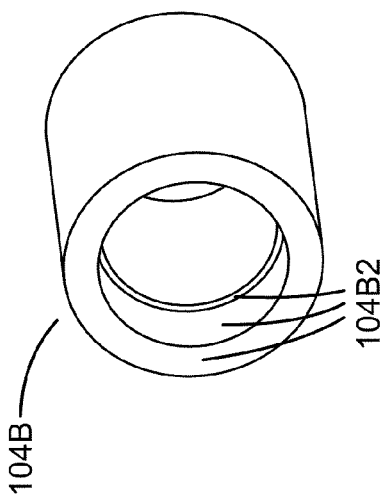
FIG. 8 is an isometric diagrammatic view illustrating the female outer conductor end portion of the embodiment of FIG. 6.

To overcome these shortcomings, i.e., low capacitance values and higher parasitic inductance, the capacitor may be formed in the outer conductor of the coaxial line instead of the center conductor. The diameter of the outer conductor is greater than the diameter of the center conductor, and so a larger capacitance value can be achieved using a similar technique as in the second embodiment, except in the outer conductor. In a further embodiment, the roles between the so called male and female outer conductor portions change. FIGS. 6-8 illustrate this embodiment of a coaxial line 100 having an inner conductor 102 and an outer conductor structure 104, with a capacitor formed in the outer conductor structure. The male connector portion 104A of the outer conductor structure is formed with protruding finger portions 104AF surrounding the hollow receptacle portion 104R, and the female connector portion 104B (FIG. 8) of the outer conductor has surfaces coated with dielectric 104B2. Again, the finger portions can be realized many different ways, by cutting finger-like protrusions or by using vias or similar transitions. The embodiment of FIGS. 6-8 may be used for circuit applications in which the outer conductor is not shorted or is connected to DC.

As described above regarding the interrupted center conductor embodiments, the two portions of the interrupted outer conductor may be formed of different materials. For example, one portion may be aluminum, and the second portion may be beryllium copper.

The capacitance value can be controlled by the relative dielectric permittivity of the coating or by changing the area of the fingers by making them longer or wider. One can achiever larger capacitance values by forming finger portions in the outer conductor as compared to the center conductor. However, similar limitations exist with regard the parasitic inductances and resonances. With the embodiments of FIGS. 1-3 where there are no fingers/vias/openings, there are virtually no parasitic inductances for resonance or band limitation for high frequency (except the cut off frequency of the next higher mode in the particular coaxial line dimensions), but one cannot achieve as high capacitance values as with the other two versions.

Several different techniques of realizing broadband capacitors in a coaxial line have been disclosed. One technique is to form the center conductor structure of the coaxial line in two segments or portions, coating one facing surface or both with a dielectric material and putting the two ends together. The two portions of the center conductor can be held together by a thin short plastic sleeve to keep them mechanically in place, which provides the widest bandwidth with least parasitic inductance. Another technique is to form the center conductor in two portions, with the end of one portion formed into a male pin portion, and the other portion formed as a female connector portion with fingers or vias or flexible printed circuit boards (PCBs), and coating the male connector portion with dielectric material, thus generating a capacitance between the fingers and the coated pin. The flexible PCB embodiment may be a thin flexible PCB with both sides covered with conductors that are connected with each other with open vias; this would replace the finger-like protrusions discussed above with respect to FIG. 3. The flexible PCB may be configured to form a tubular structure, with one end connected to an end of the outer conductor. A further technique is to form the outer conductor in two portions, with the end of one a male connector portion or pin, with finger or other extensions, again by using one of many possible different methods such as cutting fingers or putting vias or using flexible PCB, and the second piece as a female connector portion coated with dielectric.

These capacitors can be used in different RF/microwave components such as bias tees for both type of measurements CW and pulsed bias, or as any RF/microwave capacitor in a coaxial transmission line type application.

Figure 9:
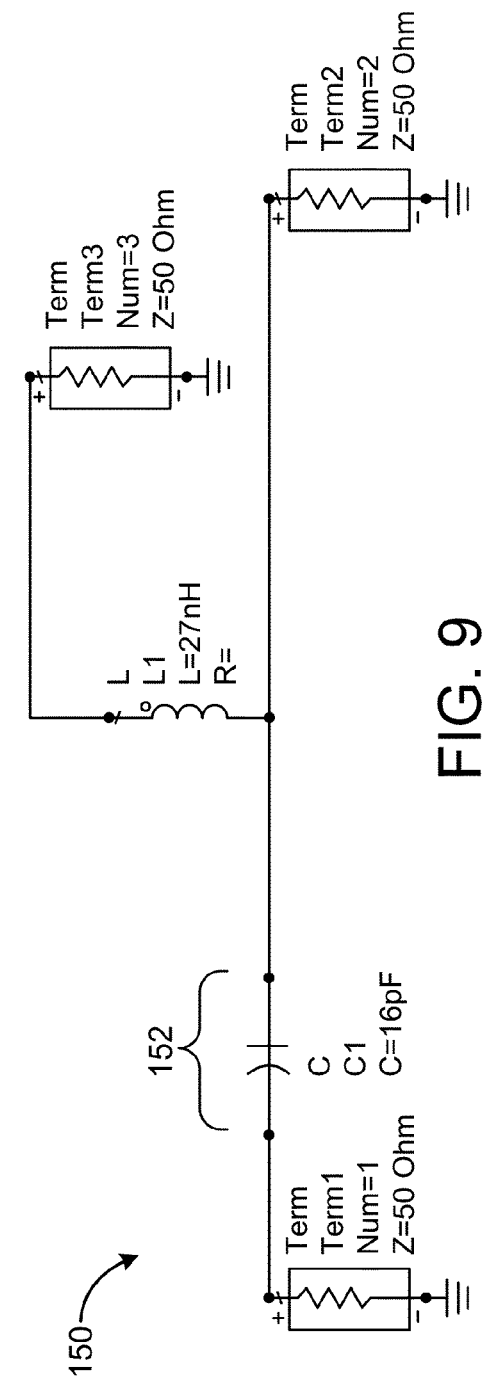
FIG. 9 is an exemplary circuit schematic of a circuit employing an RF capacitor in a coaxial airline.

FIG. 9 shows an exemplary bias tee circuit 150, using an RF capacitor 152 in a coaxial airline according to the embodiments described above with respect to FIGS. 1-5. The bias tee circuit may be used to bias a device under test (DUT) undergoing testing, e.g. as described in U.S. Pat. No. 7,589,601 (FIG. 18), the entire contents of which are incorporated herein by reference. The circuit is one example of a circuit utilizing the RF capacitor. Other circuits may advantageously employ an RF capacitor as described above as well.

Although the foregoing has been a description and illustration of specific embodiments of the subject matter, various modifications and changes thereto can be made by persons skilled in the art without departing from the scope and spirit of the invention.

What is claimed is:

1. A coaxial line with an integrated RF capacitor, comprising:
    a hollow outer conductor;
    an interrupted center conductor structure disposed within the hollow outer conductor;
    a gap defined between the hollow outer conductor and the interrupted center conductor structure;
    the interrupted center conductor structure comprising a first center conductor portion having a first face defined at an end thereof, and a second center conductor portion having a second face defined at an end thereof;
    wherein the first face and the second face are disposed in adjacent facing relationship to define a further gap there between; and
    a non-gaseous dielectric material disposed in and filling the further gap, wherein the non-gaseous dielectric material comprises an anodized coating or a chemical-vapor-deposited coating formed on one or both of the first and second faces;
    the interrupted center conductor structure, the further gap and the non-gaseous dielectric material configured to provide the integrated RF capacitor.

2. The coaxial line of claim 1, wherein the further gap has a width that is less than 10 um.

3. The coaxial line of claim 1, further comprising a dielectric sleeve disposed over the further gap and the first and second ends and configured to mechanically support the integrated RF capacitor.

4. The coaxial line of claim 3, wherein the dielectric sleeve is fabricated of a plastic material.

5. The coaxial line of claim 1, wherein the first and second faces are flat surfaces perpendicular to an axis of the interrupted center conductor structure.

6. The coaxial line of claim 1, wherein at least one of the first and second conductor portions of the interrupted center conductor structure is fabricated of aluminum, and the non-gaseous dielectric material comprises the anodized coating.

7. The coaxial line of claim 1, wherein at least one of the first and second conductor portions of the interrupted center conductor structure is fabricated of beryllium copper, and the non-gaseous dielectric material comprises the chemical-vapor-deposited coating.

8. A coaxial line with an integrated RF capacitor, comprising:
    a hollow outer conductor;
    an interrupted center conductor structure disposed within the hollow outer conductor;
    a gap defined between the hollow outer conductor and the interrupted center conductor structure;
    the interrupted center conductor structure comprising a first center conductor portion having a first face defined at an end thereof, and a second center conductor portion having a second face defined at an end thereof;
    wherein the first face and the second face are disposed in adjacent facing relationship to define a further gap there between; and
    a non-gaseous dielectric material disposed in and filling the further gap;
    the interrupted center conductor structure, the further gap and the non-gaseous dielectric material configured to provide the integrated RF capacitor; and
    wherein the first and second faces are flat surfaces disposed on a diagonal from an axis of the interrupted center conductor structure.

9. A coaxial line with an integrated RF capacitor, comprising:
    a hollow outer conductor;
    an interrupted center conductor structure disposed within the hollow outer conductor;
    the interrupted center conductor structure comprising a first center conductor portion having a first face defined at an end thereof, and a second center conductor portion having a second face defined at an end thereof;
    wherein the first face and the second face are disposed in adjacent facing relationship to define a gap there between; and
    a dielectric material disposed in and filling the gap, the dielectric material comprising a coating formed on one or both of the first and second faces;
    the interrupted center conductor structure, the gap and the dielectric material configured to provide the integrated RF capacitor.

10. A coaxial line with an RF capacitor, comprising:
    a hollow outer conductor;
    an interrupted center conductor structure concentrically disposed within the hollow outer conductor;
    a gap defined between the hollow outer conductor and the interrupted center conductor structure;
    the interrupted center conductor structure comprising a first center conductor portion having a male portion of reduced diameter defined at an end thereof, and a second center conductor portion having a female portion defined at an end thereof and having a receptacle configured to receive the male portion;
    a non-gaseous dielectric layer separating the male portion and the female portion, the dielectric layer defined by an anodized coating or a chemical-vapor-deposited coating; and
    wherein the female portion includes a plurality of finger-like protrusions with slots between adjacent protrusions or a plurality of vias.

11. The coaxial line of claim 10, wherein at least one of the first and second conductor portions of the interrupted center conductor structure is fabricated of beryllium copper, and the non-gaseous dielectric layer comprises the chemical-vapor-deposited coating.

12. The coaxial line of claim 10, wherein at least one of the first and second conductor portions of the interrupted center conductor structure is fabricated of aluminum, and the non-gaseous dielectric layer comprises the anodized coating.

13. A coaxial line with an integrated RF capacitor, comprising:
   an interrupted hollow outer conductor structure;
   a center conductor disposed within the interrupted hollow outer conductor structure;
   a gap defined between the interrupted hollow outer conductor structure and the center conductor;
   the interrupted hollow outer conductor structure comprising a first outer conductor portion having a male portion of reduced diameter defined at an end thereof, and a second outer conductor portion having a female portion defined at an end thereof and having a receptacle configured to receive the male portion;
   wherein the female portion includes a plurality of finger-like slots or a plurality of vias;
   a dielectric layer separating facing surfaces of the female portion and the male portion.

14. The coaxial line of claim 13, wherein at least one of the first and second outer conductor portions of the interrupted hollow outer conductor structure is fabricated of beryllium copper, and the dielectric layer comprises a chemical-vapor-deposited coating.

15. The coaxial line of claim 13, wherein the dielectric layer comprises a dielectric coating layer on facing surfaces of the female portion, or on facing surfaces of the male portion.

16. The coaxial line of claim 13, wherein the dielectric layer comprises an anodized coating or a chemical-vapor-deposited coating.

17. The coaxial line of claim 13, wherein at least one of the first and second outer conductor portions of the interrupted hollow outer conductor structure is fabricated of aluminum, and the dielectric layer comprises an anodized coating.

* * * * *

UNITED STATES PATENT AND TRADEMARK OFFICE
CERTIFICATE OF CORRECTION

PATENT NO.          : 9,614,267 B1
APPLICATION NO.     : 15/156199
DATED               : April 4, 2017
INVENTOR(S)         : M. Tekamül Büber, Sathya Padmanabhan and Bruce J. Pluth Page 1 of 1

It is certified that error appears in the above-identified patent and that said Letters Patent is hereby corrected as shown below:

In the Claims

At Column 10, Line 1, Claim 1, replace "female" with --male--

Signed and Sealed this
Thirtieth Day of January, 2018

Joseph Matal
*Performing the Functions and Duties of the*
*Under Secretary of Commerce for Intellectual Property and*
*Director of the United States Patent and Trademark Office*

UNITED STATES PATENT AND TRADEMARK OFFICE
CERTIFICATE OF CORRECTION

PATENT NO. : 9,614,267 B1
APPLICATION NO. : 15/156199
DATED : April 4, 2017
INVENTOR(S) : M. Tekamül Büber, Sathya Padmanabhan and Bruce J. Pluth Page 1 of 1

It is certified that error appears in the above-identified patent and that said Letters Patent is hereby corrected as shown below:

In the Claims

At Column 10, Line 1, Claim 13, replace "female" with --male--

This certificate supersedes the Certificate of Correction issued January 30, 2018.

Signed and Sealed this
Thirteenth Day of August, 2019

Andrei Iancu
*Director of the United States Patent and Trademark Office*